(12) United States Patent
Payne (10) Patent No.: US 8,403,030 B2
(45) Date of Patent: Mar. 26, 2013

(54) COOLING MANIFOLD

(75) Inventor: Josh Payne, Royal Oak, MI (US)

(73) Assignee: LG Chem, Ltd., Seoul (KR)

( * ) Notice: Subject to any disclaimer, the term of this patent is extended or adjusted under 35 U.S.C. 154(b) by 511 days.

(21) Appl. No.: 12/433,427

(22) Filed: Apr. 30, 2009

(65) Prior Publication Data

US 2010/0276132 A1 Nov. 4, 2010

(51) Int. Cl.
*F28F 7/00* (2006.01)
*H01M 10/50* (2006.01)

(52) U.S. Cl. ....... 165/80.4; 165/185; 361/699; 361/704; 429/120

(58) Field of Classification Search .............. 165/80.4, 165/185; 361/699, 704; 429/120
See application file for complete search history.

(56) References Cited

U.S. PATENT DOCUMENTS

| | | | |
|---|---|---|---|
| 2,273,244 A | 2/1942 | Cornelius | |
| 2,391,859 A | 1/1946 | Earl | |
| 3,503,558 A | 3/1970 | Galiulo et al. | |
| 3,522,100 A | 7/1970 | Lindstrom | |
| 3,550,681 A * | 12/1970 | Stier et al. | 165/185 |
| 3,668,757 A | 6/1972 | Rieder | |
| 3,964,930 A | 6/1976 | Reiser | |
| 4,009,752 A * | 3/1977 | Wilson | 165/185 |
| 4,063,590 A * | 12/1977 | McConnell | 165/170 |
| 4,298,904 A * | 11/1981 | Koenig | 361/720 |
| 4,322,776 A * | 3/1982 | Job et al. | 361/720 |
| 4,390,841 A | 6/1983 | Martin et al. | |
| 4,444,994 A * | 4/1984 | Baker et al. | 165/80.3 |
| 4,518,663 A | 5/1985 | Kodali et al. | |
| 4,646,202 A * | 2/1987 | Hook et al. | 165/80.4 |
| 4,701,829 A * | 10/1987 | Bricaud et al. | 361/721 |
| 4,777,561 A * | 10/1988 | Murphy et al. | 165/80.4 |
| 4,849,858 A * | 7/1989 | Grapes et al. | 165/185 |
| 4,995,240 A | 2/1991 | Barthel et al. | |
| 5,057,968 A * | 10/1991 | Morrison | 165/80.4 |
| 5,071,652 A | 12/1991 | Jones et al. | |
| 5,214,564 A * | 5/1993 | Metzler et al. | 361/699 |
| 5,270,131 A | 12/1993 | Diethelm et al. | |
| 5,322,745 A | 6/1994 | Yanagihara et al. | |

(Continued)

FOREIGN PATENT DOCUMENTS

| | | |
|---|---|---|
| EP | 1577966 A | 9/2005 |
| EP | 1852925 A | 11/2007 |

(Continued)

OTHER PUBLICATIONS

U.S. Appl. No. 12/165,100, filed Jun. 30, 2008 entitled Battery Cell Assembly Having Heat Exchanger with Serpentine Flow Path.

(Continued)

*Primary Examiner* — Leonard R Leo
(74) *Attorney, Agent, or Firm* — Buckert Patent & Trademark Law Firm, P.C.

(57) ABSTRACT

A cooling manifold and a method for manufacturing the cooling manifold are provided. The cooling manifold includes a housing that defines an interior region having a serpentine flow path therein. The housing has a first plurality of grooves extending from a first surface of the housing into the housing. The grooves do not fluidly communicate with the interior region. The first plurality of grooves receive a portion of a thermally conductive member therein to conduct heat energy from the thermally conductive member to the housing. The cooling manifold further includes a top cap configured to seal a first end of the housing and a bottom cap configured to seal a second end of the housing.

7 Claims, 12 Drawing Sheets

U.S. PATENT DOCUMENTS

| | | |
|---|---|---|
| 5,329,988 A | 7/1994 | Juger |
| 5,346,786 A | 9/1994 | Hodgetts |
| 5,356,735 A | 10/1994 | Meadows et al. |
| 5,510,203 A | 4/1996 | Hamada et al. |
| 5,520,976 A * | 5/1996 | Giannetti et al. ............ 428/36.3 |
| 5,606,242 A | 2/1997 | Hull et al. |
| 5,652,502 A | 7/1997 | Van Phuoc et al. |
| 5,658,682 A | 8/1997 | Usuda et al. |
| 5,663,007 A | 9/1997 | Ikoma et al. |
| 5,736,836 A | 4/1998 | Hasegawa et al. |
| 5,756,227 A | 5/1998 | Suzuki et al. |
| 5,796,239 A | 8/1998 | Van Phuoc et al. |
| 5,825,155 A | 10/1998 | Ito et al. |
| 5,937,664 A | 8/1999 | Matsuno et al. |
| 5,941,303 A | 8/1999 | Gowan et al. |
| 5,982,403 A | 11/1999 | Inagaki |
| 6,016,047 A | 1/2000 | Notten et al. |
| 6,087,036 A | 7/2000 | Rouillard et al. |
| 6,111,387 A | 8/2000 | Kouzu et al. |
| 6,176,095 B1 | 1/2001 | Porter |
| 6,344,728 B1 | 2/2002 | Kouzu et al. |
| 6,353,815 B1 | 3/2002 | Vilim et al. |
| 6,362,598 B2 | 3/2002 | Laig-Horstebrock et al. |
| 6,399,238 B1 | 6/2002 | Oweis et al. |
| 6,441,586 B1 | 8/2002 | Tate, Jr. et al. |
| 6,462,949 B1 | 10/2002 | Parish, IV et al. |
| 6,512,347 B1 | 1/2003 | Hellmann et al. |
| 6,515,454 B2 | 2/2003 | Schoch |
| 6,534,954 B1 | 3/2003 | Plett |
| 6,563,318 B2 | 5/2003 | Kawakami et al. |
| 6,569,556 B2 | 5/2003 | Zhou et al. |
| 6,662,891 B2 | 12/2003 | Misu et al. |
| 6,689,510 B1 | 2/2004 | Gow et al. |
| 6,696,197 B2 | 2/2004 | Inagaki et al. |
| 6,724,172 B2 | 4/2004 | Koo |
| 6,750,630 B2 | 6/2004 | Inoue et al. |
| 6,775,998 B2 | 8/2004 | Yuasa et al. |
| 6,780,538 B2 | 8/2004 | Hamada et al. |
| 6,821,671 B2 | 11/2004 | Hinton et al. |
| 6,826,948 B1 | 12/2004 | Bhatti et al. |
| 6,829,562 B2 | 12/2004 | Sarfert |
| 6,832,171 B2 | 12/2004 | Barsoukov et al. |
| 6,876,175 B2 | 4/2005 | Schoch |
| 6,878,485 B2 | 4/2005 | Ovshinsky et al. |
| 6,892,148 B2 | 5/2005 | Barsoukov et al. |
| 6,927,554 B2 | 8/2005 | Tate, Jr. et al. |
| 6,943,528 B2 | 9/2005 | Scoch |
| 6,967,466 B2 | 11/2005 | Koch |
| 6,982,131 B1 | 1/2006 | Hamada et al. |
| 7,012,434 B2 | 3/2006 | Koch |
| 7,039,534 B1 | 5/2006 | Ryno et al. |
| 7,061,246 B2 | 6/2006 | Dougherty et al. |
| 7,070,874 B2 | 7/2006 | Blanchet et al. |
| 7,072,871 B1 | 7/2006 | Tinnemeyer |
| 7,098,665 B2 | 8/2006 | Laig-Hoerstebrock |
| 7,109,685 B2 | 9/2006 | Tate, Jr. et al. |
| 7,126,312 B2 | 10/2006 | Moore |
| 7,143,124 B2 | 11/2006 | Garthwaite |
| 7,150,935 B2 | 12/2006 | Hamada et al. |
| 7,197,487 B2 | 3/2007 | Hansen et al. |
| 7,199,557 B2 | 4/2007 | Anbuky et al. |
| 7,250,741 B2 | 7/2007 | Koo et al. |
| 7,253,587 B2 | 8/2007 | Meissner |
| 7,264,902 B2 | 9/2007 | Horie et al. |
| 7,278,389 B2 | 10/2007 | Kirakosyan |
| 7,315,789 B2 | 1/2008 | Plett |
| 7,321,220 B2 | 1/2008 | Plett |
| 7,327,147 B2 | 2/2008 | Koch |
| 7,467,525 B1 | 12/2008 | Ohta et al. |
| 7,531,270 B2 | 5/2009 | Buck et al. |
| 7,795,845 B2 | 9/2010 | Cho |
| 7,797,958 B2 | 9/2010 | Alston et al. |
| 7,816,029 B2 | 10/2010 | Takamatsu et al. |
| 7,846,573 B2 | 12/2010 | Kelly |
| 7,879,480 B2 | 2/2011 | Yoon et al. |
| 7,883,793 B2 | 2/2011 | Niedzwiecki et al. |
| 7,976,978 B2 | 7/2011 | Shin et al. |
| 7,981,538 B2 | 7/2011 | Kim et al. |
| 7,997,367 B2 | 8/2011 | Nakamura |
| 8,007,915 B2 | 8/2011 | Kurachi |
| 8,030,886 B2 | 10/2011 | Mahalingam et al. |
| 8,067,111 B2 | 11/2011 | Koetting et al. |
| 2001/0035739 A1 | 11/2001 | Laig-Horstebrock et al. |
| 2002/0130637 A1 | 9/2002 | Schoch |
| 2002/0169581 A1 | 11/2002 | Sarfert |
| 2002/0182493 A1 | 12/2002 | Ovshinsky et al. |
| 2003/0052690 A1 | 3/2003 | Schoch |
| 2003/0184307 A1 | 10/2003 | Kozlowski et al. |
| 2003/0211384 A1 | 11/2003 | Hamada et al. |
| 2004/0000892 A1 | 1/2004 | Jae-Seung |
| 2004/0032264 A1 | 2/2004 | Schoch |
| 2004/0189257 A1 | 9/2004 | Dougherty et al. |
| 2005/0001627 A1 | 1/2005 | Anbuky et al. |
| 2005/0026014 A1 | 2/2005 | Fogaing et al. |
| 2005/0035742 A1 | 2/2005 | Koo et al. |
| 2005/0046388 A1 | 3/2005 | Tate, Jr. et al. |
| 2005/0089750 A1 | 4/2005 | Ng et al. |
| 2005/0100786 A1 | 5/2005 | Ryu et al. |
| 2005/0103486 A1 | 5/2005 | Demuth et al. |
| 2005/0110460 A1 | 5/2005 | Arai et al. |
| 2005/0127874 A1 | 6/2005 | Lim et al. |
| 2005/0134038 A1 | 6/2005 | Walsh |
| 2005/0194936 A1 | 9/2005 | Cho |
| 2006/0097698 A1 | 5/2006 | Plett |
| 2006/0100833 A1 | 5/2006 | Plett |
| 2006/0111854 A1 | 5/2006 | Plett |
| 2006/0111870 A1 | 5/2006 | Plett |
| 2006/0234119 A1 | 10/2006 | Kruger et al. |
| 2006/0286450 A1 | 12/2006 | Yoon et al. |
| 2007/0035307 A1 | 2/2007 | Scoch |
| 2007/0046292 A1 | 3/2007 | Plett |
| 2007/0087266 A1 | 4/2007 | Bourke et al. |
| 2007/0103120 A1 | 5/2007 | Plett |
| 2007/0120533 A1 | 5/2007 | Plett |
| 2007/0188143 A1 | 8/2007 | Plett |
| 2007/0236182 A1 | 10/2007 | Plett |
| 2008/0003491 A1 | 1/2008 | Yahnker et al. |
| 2008/0041079 A1 | 2/2008 | Nishijima et al. |
| 2008/0094035 A1 | 4/2008 | Plett |
| 2008/0182151 A1 | 7/2008 | Mizusaki et al. |
| 2008/0248338 A1 | 10/2008 | Yano et al. |
| 2009/0029239 A1 | 1/2009 | Koetting et al. |
| 2009/0087727 A1 | 4/2009 | Harada et al. |
| 2009/0104512 A1 | 4/2009 | Fassnacht et al. |
| 2009/0155680 A1 | 6/2009 | Maguire et al. |
| 2009/0186265 A1 | 7/2009 | Koetting et al. |
| 2009/0258288 A1 | 10/2009 | Weber et al. |
| 2009/0280395 A1 | 11/2009 | Nemesh et al. |
| 2009/0325052 A1 | 12/2009 | Koetting et al. |
| 2009/0325054 A1 | 12/2009 | Payne et al. |
| 2009/0325055 A1 | 12/2009 | Koetting et al. |
| 2010/0112419 A1 | 5/2010 | Jang et al. |
| 2010/0203376 A1 | 8/2010 | Choi et al. |
| 2010/0209760 A1 | 8/2010 | Yoshihara et al. |
| 2010/0262791 A1 | 10/2010 | Gilton |
| 2010/0275619 A1 | 11/2010 | Koetting et al. |
| 2010/0279152 A1 | 11/2010 | Payne |
| 2010/0279154 A1 | 11/2010 | Koetting et al. |
| 2011/0027640 A1 | 2/2011 | Gadawski et al. |
| 2011/0041525 A1 | 2/2011 | Kim et al. |
| 2011/0052959 A1 | 3/2011 | Koetting et al. |
| 2012/0082880 A1 | 4/2012 | Koetting et al. |

FOREIGN PATENT DOCUMENTS

| | | |
|---|---|---|
| JP | 08111244 | 4/1996 |
| JP | 09129213 | 5/1997 |
| JP | 09219213 | 8/1997 |
| JP | 2001105843 A | 4/2001 |
| JP | 2002038033 A | 2/2002 |
| JP | 2002319383 A | 10/2002 |
| JP | 2003188323 A | 7/2003 |
| JP | 2005126315 A | 5/2005 |
| JP | 2005349955 A | 12/2005 |
| JP | 2006139928 A | 6/2006 |
| JP | 2007305425 A | 11/2007 |
| JP | 2008054379 A | 3/2008 |
| JP | 2008062875 A | 3/2008 |

| | | | |
|---|---|---|---|
| JP | 2008080995 A | 4/2008 | |
| JP | 2008159440 A | 7/2008 | |
| JP | 2009009889 A | 1/2009 | |
| JP | 2009054297 A | 3/2009 | |
| KR | 20050092605 A | 9/2005 | |
| KR | 100637472 B1 | 10/2006 | |
| KR | 100765659 B1 | 10/2007 | |
| KR | 20080047641 A | 5/2008 | |
| KR | 20090082212 A | 7/2009 | |
| KR | 100921346 B1 | 10/2009 | |
| WO | 2006101343 A | 9/2006 | |
| WO | 2007007503 A | 1/2007 | |
| WO | 2007115743 A2 | 10/2007 | |
| WO | 2009073225 A | 6/2009 | |

OTHER PUBLICATIONS

U.S. Appl. No. 12/164,780, filed Jun. 30, 2008 entitled Battery Module Having Battery Cell Assembly with Heat Exchanger.

U.S. Appl. No. 12/164,627, filed Jun. 30, 2008 entitled Liquid Cooled Battery Manifold Assembly with Flow Balancing Feature.

U.S. Appl. No. 12/246,073, filed Oct. 6, 2008 entitled Battery Cell Carrier That Engages Side Walls of Active Cell.

U.S. Appl. No. 12/164,445, filed Jun. 30, 2008 entitled Battery Module Having a Rubber Cooling Manifold.

U.S. Appl. No. 12/016,630, filed Jan. 18, 2008 entitled Battery Cell Assembly and Method for Assembling the Battery Cell Assembly.

U.S. Appl. No. 12/258,696, filed Oct. 27, 2008 entitled Battery Module Having Cooling Manifold with Ported Screws and Method for Cooling the Battery Module.

U.S. Appl. No. 12/433,155, filed Apr. 30, 2009 entitled Cooling System for a Battery and a Method for Cooling the Battery System.

U.S. Appl. No. 12/433,485, filed Apr. 30, 2009 entitled Battery Systems, Battery Module, and Method for Cooling the Battery Module.

U.S. Appl. No. 12/433,534, filed Apr. 30, 2009 entitled Battery Systems, Battery Modules, and Method for Cooling a Battery Module.

U.S. Appl. No. 12/433,397, filed Apr. 30, 2009 entitled Battery Systems, Battery Modules, and Method for Cooling a Battery Module.

U.S. Appl. No. 12/164,741, filed Jun. 30, 2008 entitled Battery Module Having Battery Cell Assemblies with Alignment-Coupling Features.

U.S. Appl. No. 12/426,795, filed Apr. 20, 2009 entitled Frame Member, Frame Assembly and Battery Cell Assembly Made Therefrom and Methods of Making the Same.

"Gasket". Merriam-Webster. Merriam-Webster. Web. May 30, 2012. <http://www.merriam-webster.com/dictionary/gasket>.

International Search Report; International Application No. PCT/KR2009/000258; International Filing Date: Jan. 16, 2009; Date of Mailing: Aug. 28, 2009; 2 pages.

International Search Report; International Application No. PCT/KR2009/003428, International Filing Date: Jun. 25, 2009; Date of Mailing: Jan. 22, 2010; 2 pages.

International Search Report; International Application No. PCT/KR2009/003429; International Filing Date: Jun. 25, 2009; Date of Mailing: Jan. 12, 2010; 3 pages.

International Search Report; International Application No. PCT/KR2009/003430; International Filing Date: Jun. 25, 2009; Date of Mailing: Feb. 3, 2010; 2 pages.

International Search Report; International Application No. PCT/KR2009/003434; International Filing Date: Jun. 25, 2009; Date of Mailing: Jan. 18, 2010; 2 pages.

International Search Report; International Application No. PCT/KR2009/003436; International Filing Date: Jun. 25, 2009; Date of Mailing: Jan. 22, 2010; 2 pages.

International Search Report; International Application No. PCT/KR2009/006121; International Filing Date: Oct. 22, 2009; Date of Mailing: May 3, 2010; 2 pages.

International Search Report; International Application No. PCT/KR2010/002334; International Filing Date: Apr. 15, 2010; Date of Mailing: Nov. 29, 2010; 2 pages.

International Search Report; International Application No. PCT/KR2010/002336; International Filing Date: Apr. 15, 2010; Date of Mailing: Jan. 31, 2011; 2 pages.

International Search Report; International Application No. PCT/KR2010/002337; International Filing Date: Apr. 15, 2010; Date of Mailing: May 3, 2010; 2 pages.

International Search Report; International Application No. PCT/KR2010/002340; International Filing Date: Apr. 15, 2010; Date of Mailing: Jan. 31, 2011; 2 pages.

International Search Report; International Application No. PCT/KR2010/004944; International Filing Date: Jul. 28, 2010; Date of Mailing: Apr. 29, 2011; 2 pages.

International Search Report; International Application No. PCT/KR2010/005639; International Filing Date: Aug. 24, 2010; Date of Mailing: Jun. 3, 2011; 2 pages.

Machine translation of Japanese Patent Application No. 2009-009889 A, published Jan. 15, 2009.

Thomas J. Gadawski et al., pending U.S. Appl. No. 13/433,649 entitled "Battery System and Method for Cooling the Battery System," filed with the U.S. Patent and Trademark Office on Mar. 29, 2012.

U.S. Appl. No. 13/475,963, filed May 19, 2012 entitled Battery Cell Assembly and Method for Manufacturing a Cooling Fin for the Battery Cell Assembly.

* cited by examiner

COOLING MANIFOLD

TECHNICAL FIELD

This application relates to cooling manifold and a method for manufacturing the cooling manifold.

BACKGROUND OF THE INVENTION

In a typical air-cooled battery pack, ambient air from ambient atmosphere is directed across battery cells in the battery pack and is subsequently exhausted from the battery pack. However, the typical air-cooled battery pack has a major challenge in maintaining a temperature of the battery pack within a desired temperature range.

In particular, a maximum operating temperature of the battery cells can often be less than a temperature of ambient air utilized to cool the batteries. In this situation, it is impossible to maintain the battery cells within a desired temperature range in an air-cooled battery pack.

Accordingly, the inventors herein have recognized a need for an improved cooling manifold that minimizes and/or eliminates the above-mentioned deficiency.

SUMMARY OF THE INVENTION

A cooling manifold in accordance with another exemplary embodiment is provided. The cooling manifold includes a housing that defines an interior region having a serpentine flow path therein. The housing has a first plurality of grooves extending from a first surface of the housing into the housing. The grooves do not fluidly communicate with the interior region. The first plurality of grooves are configured to receive a portion of a thermally conductive member therein to conduct heat energy from the thermally conductive member to the housing. The cooling manifold further includes a top cap configured to seal a first end of the housing. The top cap has first and second apertures extending therethrough. The cooling manifold further includes a bottom cap configured to seal a second end of the housing. The cooling manifold further includes a first fluid port coupled to the top cap such that the first fluid port fluidly communicates with the first aperture in the top cap. The cooling manifold further includes a second fluid port coupled to the top cap such that the second fluid port fluidly communicates with the second aperture in the top cap.

A method for manufacturing a cooling manifold in accordance with another exemplary embodiment is provided. The method includes extruding a housing having an interior region utilizing an extrusion device. The housing has a plurality of grooves extending from a first surface of the housing into the housing. The grooves do not fluidly communicate with the interior region. The plurality of grooves are configured to receive a portion of a thermally conductive member therein to conduct heat energy from the thermally conductive member to the housing. The method further includes removing end portions of the housing within the interior region to form a serpentine flow path within the housing utilizing a milling device. The method further includes brazing a top cap to a first end of the housing to seal the first end utilizing a brazing device. The top cap has first and second apertures extending therethrough. The method further includes brazing a bottom cap to a second end of the housing to seal the second end utilizing the brazing device. The method further includes brazing a first fluid port to the top cap such that the first fluid port fluidly communicates with the first aperture in the top cap utilizing the brazing device. The method further includes brazing a second fluid port to the top cap such that the second fluid port fluidly communicates with the second aperture in the top cap utilizing the brazing device.

DETAILED DESCRIPTION OF EXEMPLARY EMBODIMENTS

Figure 1:
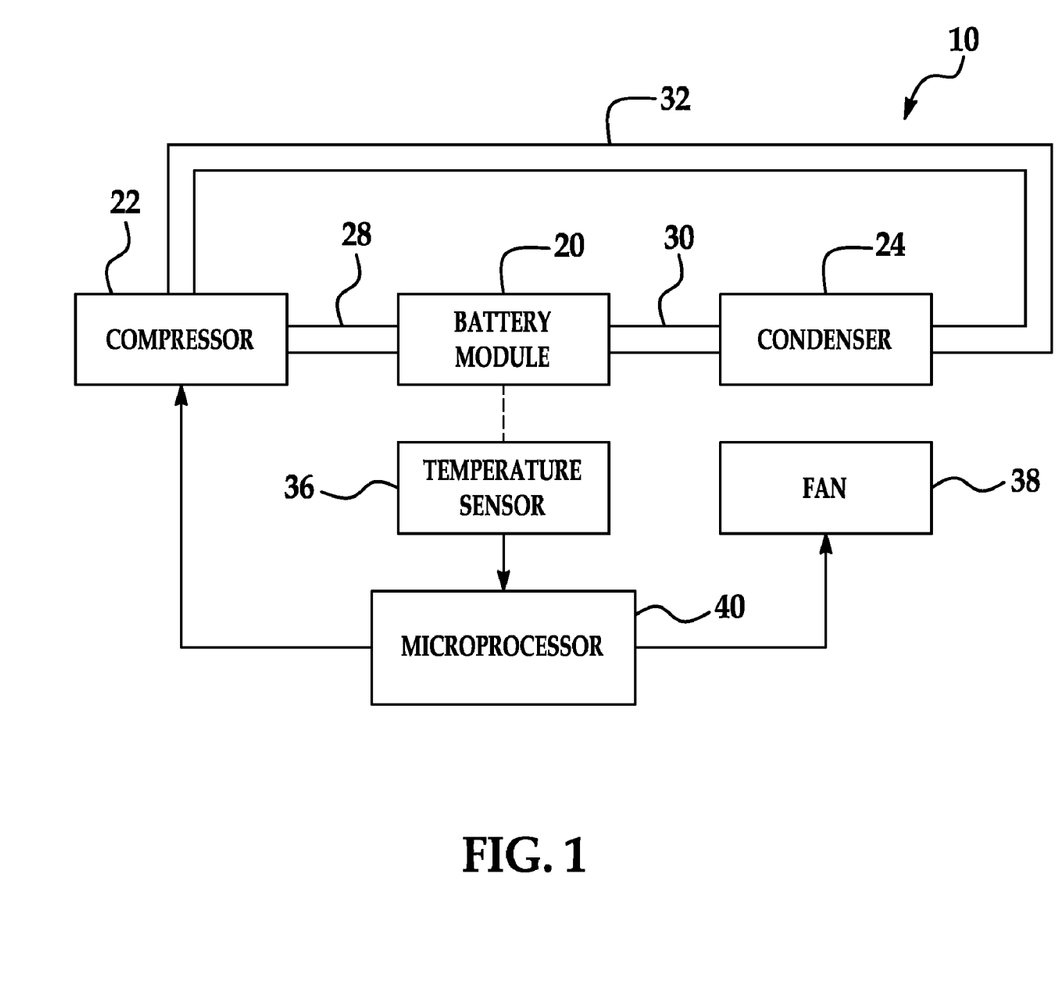
FIG. 1 is a schematic of a battery system in accordance with an exemplary embodiment.

Referring to FIG. 1, a battery system 10 for generating electrical power in accordance with an exemplary embodiment is illustrated. The battery system 10 includes a battery module 20, a compressor 22, a condenser 24, conduits 28, 30, 32, a temperature sensor 36, a fan 38, and a microprocessor 40. An advantage of the battery module 20 is that the battery module utilizes graphite sheets and cooling manifolds conduct heat energy from battery cells in the battery module 20 to effectively cool the battery cells.

For purposes of understanding, the term "fluid" means either a liquid or a gas. For example, a fluid can comprise either a coolant or a refrigerant. Exemplary coolants include ethylene glycol and propylene glycol. Exemplary refrigerants include R-11, R-12, R-22, R-134A, R-407C and R-410A.

Figure 2:
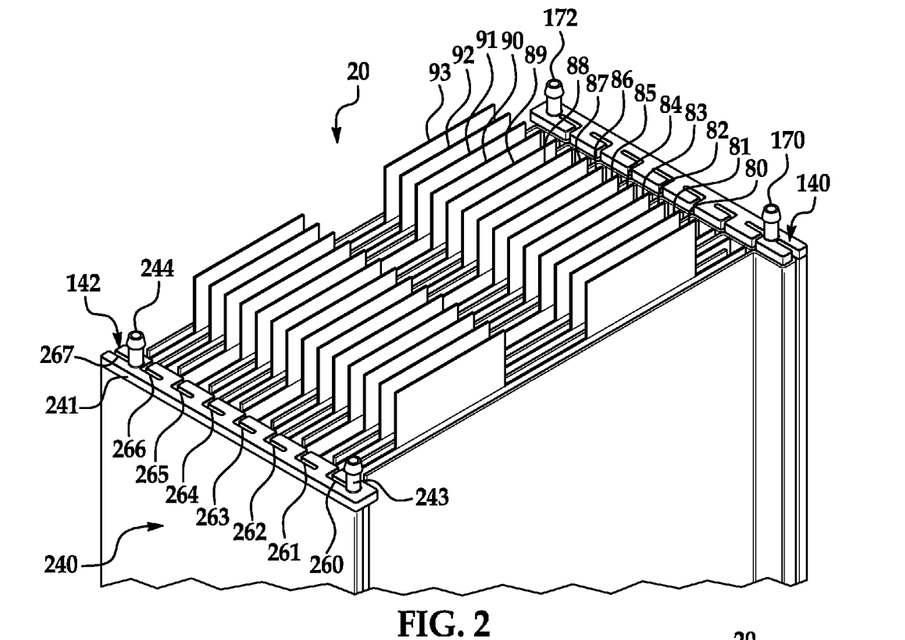
FIG. 2 is a schematic of a battery module utilized in the battery system of FIG. 1 in accordance with another exemplary embodiment.
Figure 3:
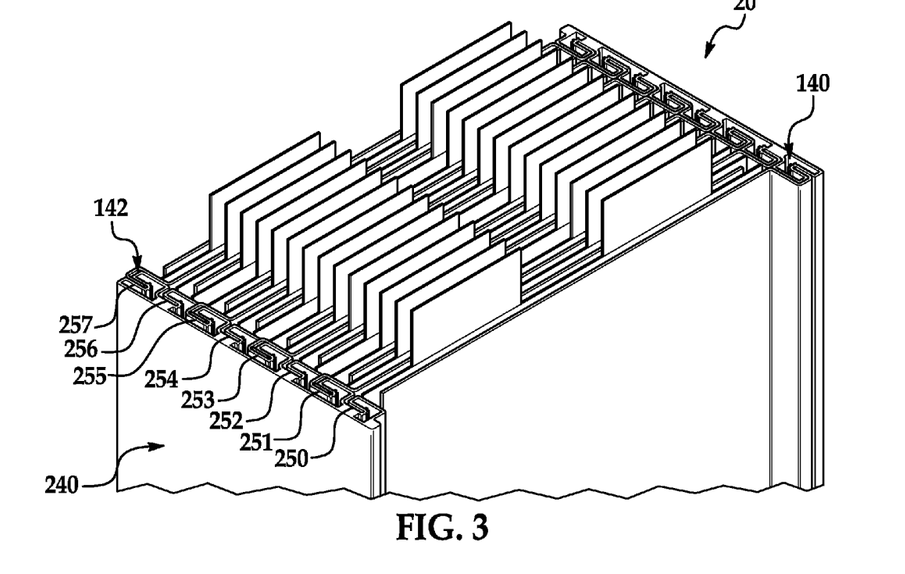
FIG. 3 is another schematic of the battery module of FIG. 2 having first and second top caps removed from first and second cooling manifolds, respectively, in the battery module.
Figure 4:
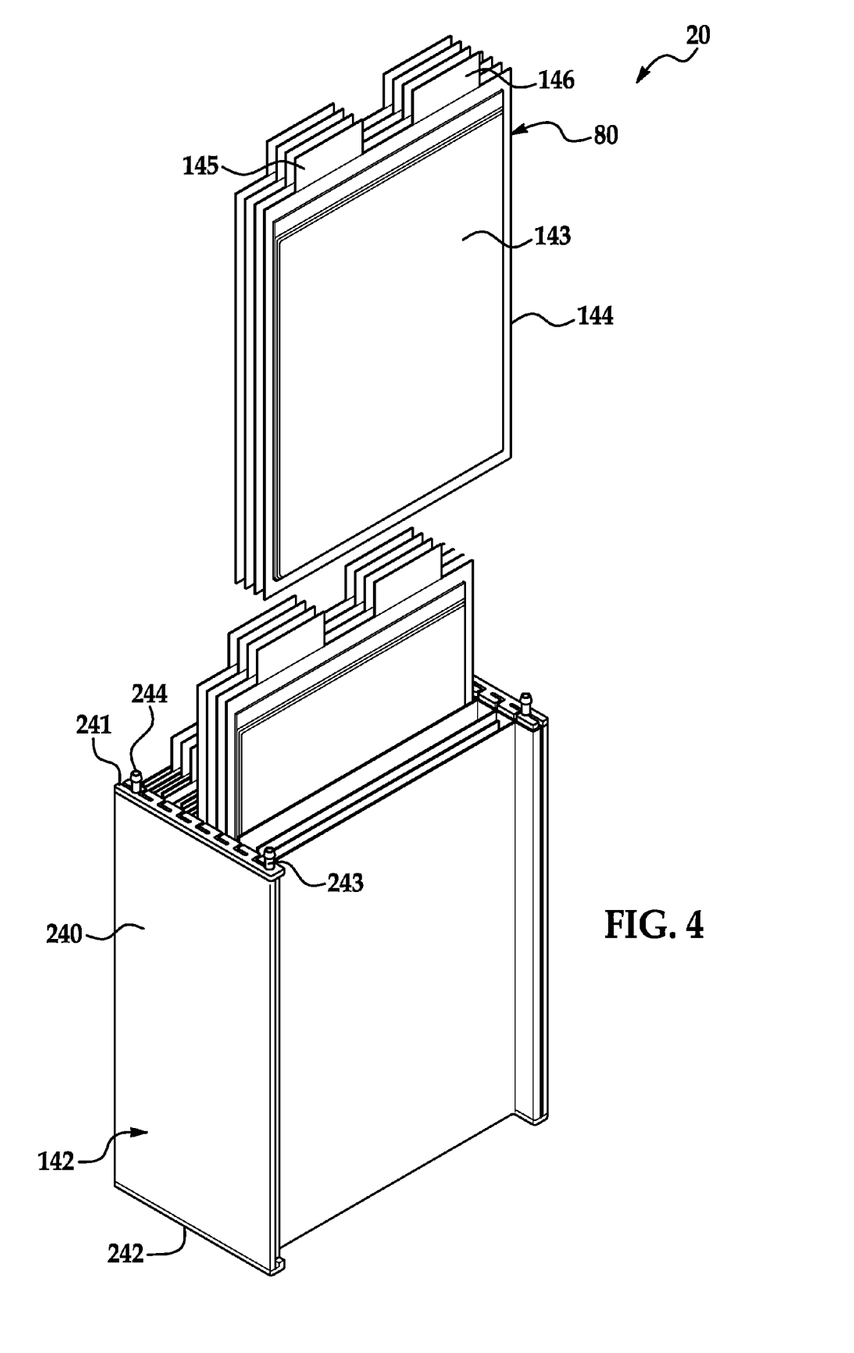
FIG. 4 is another schematic of the battery module of FIG. 2.

Referring to FIGS. 2-4, the battery module 20 is provided to generate a voltage therein in accordance with another exemplary embodiment. The battery module 20 includes battery cells 80, 81, 82, 83, 84, 85, 86, 87, 88, 89, 90, 91, 92, 93, graphite sheets 102, 104, 106, 108, 110, 112, 114, 116, 118, 120, 122, 124, and cooling manifolds 140, 142.

The battery cells 80, 81, 82, 83, 84, 85, 86, 87, 88, 89, 90, 91, 92, 93 are each provided to generate an operational voltage. Further, since each battery cell may have an identical structure, only the structure of the battery cell 80 will be described in further detail. As shown, the battery cell 80 includes a body portion 143, a peripheral extension portion 144, and electrodes 145, 146. The body portion 143 is generally rectangular-shaped and has the peripheral extension portion 144 extending around a periphery of the body portion 143. In an exemplary embodiment, the electrodes 145, 146 extend from a top portion of the battery cell 80 and have an operational voltage generated therebetween. In one exemplary embodiment, each battery cell is a lithium-ion battery cell. In alternative embodiments, the battery cells could be nickel-cadmium battery cells or nickel metal hydride battery cells for example. Of course, other types of battery cells known to those skilled in the art could be utilized.

Figures 5, 6:
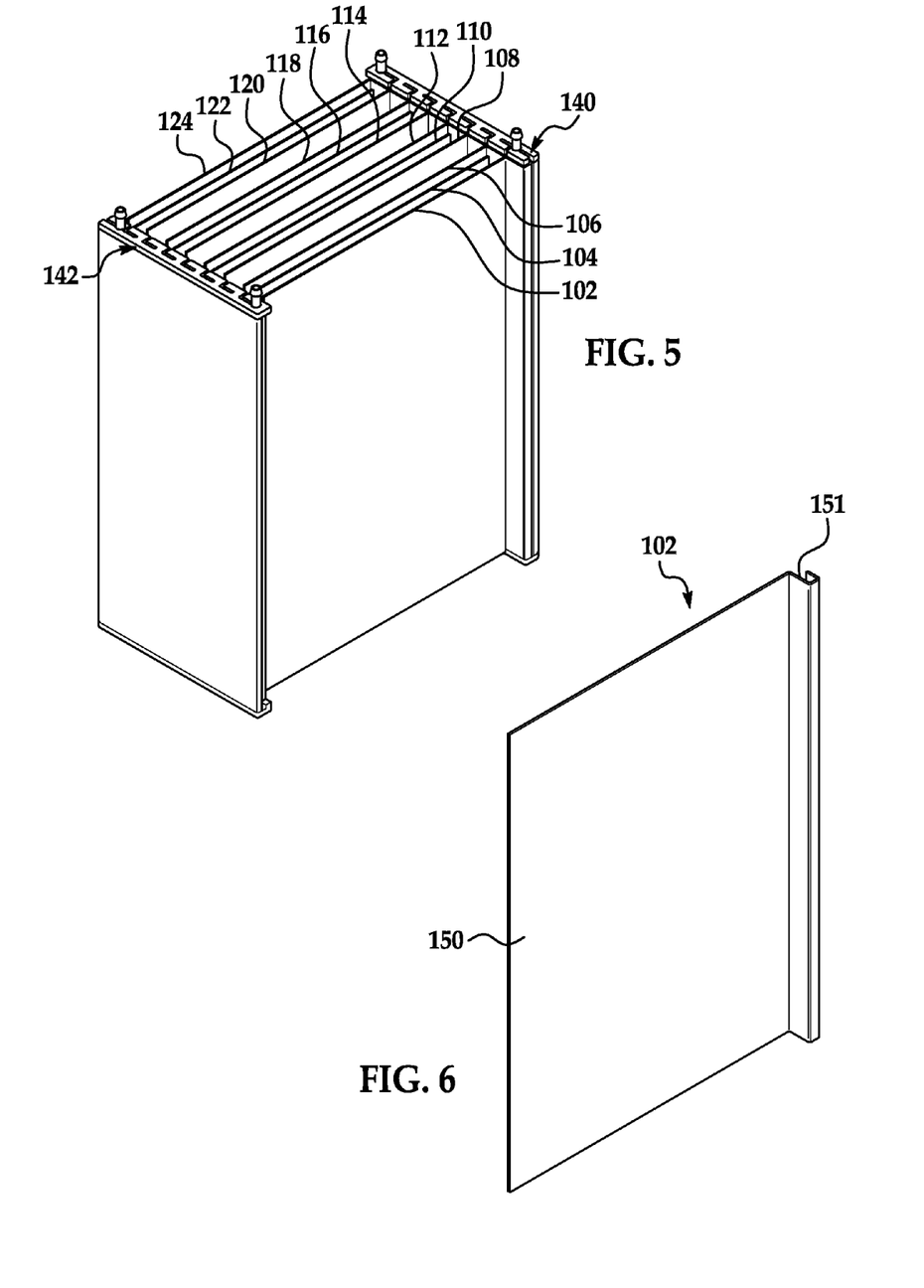
FIG. 5 is a schematic of graphite sheets and first and second cooling manifolds utilized in the battery module of FIG. 2.
FIG. 6 is a schematic of a graphite sheet utilized in the battery module of FIG. 2.
Figure 7:
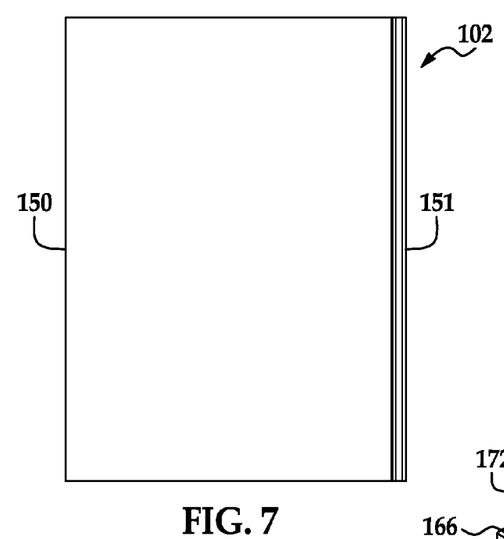
FIG. 7 is another schematic of the graphite sheet of FIG. 6.

Referring to FIGS. 2 and 5, the graphite sheets 102, 104, 106, 108, 110, 112, 114, 116, 118, 120, 122, 124 are provided to conduct heat energy from the battery cells 80, 81, 82, 83, 84, 85, 86, 87, 88, 89, 90, 91, 92, 93 into the cooling manifolds 140, 142 to cool the battery cells. In particular, the graphite sheets and cooling manifolds can maintain the battery cells within a desired temperature range, and in particular can maintain the battery cells at a temperature less than a threshold temperature level. In one exemplary embodiment, the desired temperature range is 15° Celsius-35° Celsius. In another exemplary embodiment, the threshold temperature level is 40° Celsius.

Referring to FIGS. 5-7 and 12, the graphite sheets 102, 104, 106, 108, 110, 112, 114, 116, 118, 120, 122, 124 have an identical structure. Accordingly, only the structure of the graphite sheet 102 will be described in greater detail below. As shown, the graphite sheet 102 includes a flat panel portion 150, and an extension portion 151 extending from the flat panel portion 150. The extension portion 151 includes portions 152, 153, 154. The portion 152 extends from the flat-panel portion 150 (rightwardly in FIG. 12). Further, the portion 153 extends from the portion 152 in a perpendicular direction (upwardly in FIG. 12) with respect to the portion 153, and substantially parallel to the flat panel portion 150. Further, the portion 154 extends from the portion 153 in a perpendicular direction (leftwardly in FIG. 12), and substantially parallel to the portion 152. As shown, the graphite sheet 102 is coupled to the cooling manifold 140 by inserting the portions 153, 154 in the groove 210 of the cooling manifold 140. Further, the u-shaped configuration of the extension portion 151 contacts a relatively large surface area of the cooling manifold 140 to effectively conduct heat energy from the battery cell 80 to the cooling manifold 140. In particular, each of the graphite sheets 102, 104, 106, 108, 112, 114, 118, 120, 124 have an extension portion that is received within a corresponding groove of the cooling manifold 140. Further, each of the graphite sheets 104, 110, 116, 122 have an extension portion that is received within a corresponding groove of the cooling manifold 142. In an exemplary embodiment, the graphite sheets have a polyethylene coating thereon to prevent electrical conductivity through the graphite sheets. Further, in an exemplary embodiment, each of the graphite sheets has a thickness in a range of 0.5 mm to 2.0 mm. Of course, in alternative embodiments, the graphite sheets could have a thickness greater than 2.0 mm or less than 0.5 mm.

Referring to FIGS. 8-12, the cooling manifold 140 is provided to conduct heat energy from the graphite sheets into a refrigerant flowing through the cooling manifold 140. The cooling manifold 140 includes an extruded housing 160, a top cap 166, a bottom cap 168, and fluid ports 170, 172. The housing 160, the top cap 166, the bottom cap 168, and the fluid ports 170, 172 can be constructed from at least one of aluminum, copper, silver, gold, and alloys thereof. The extruded housing 160 defines an interior region 162 for receiving a refrigerant therein. The housing 160 defines a serpentine flow path therein from the fluid port 170 to the fluid port 172. The serpentine flow path includes the flow channels 180, 182, 184, 186, 188, 190, 192, 194 that fluidly communicate with one another. Further, the housing 160 defines grooves 209, 210, 212, 214, 216, 217, 218, 220 extending therein for receiving corresponding extension portions of graphite sheets therein. Since the grooves 210, 212, 214, 216, 217, 218, 220 have an identical shape, only the shape of groove 210 will be explained in greater detail. In particular, the groove 210 includes a groove portion 221 that extends into the housing 160 perpendicular to a surface 223 of the housing 160. Further, the groove 210 includes a groove portion 222 extends from an end of the groove portion 221 parallel to the surface 223. It should be noted that the groove 210 does not fluidly communicate with the interior region 162, nor to the other grooves of the housing 160.

It should be noted that in an alternative embodiment, the grooves in the housing 160 of the cooling manifold 140 could have a different configuration or shape than the illustrated grooves, depending on a type of member being coupled to the cooling manifold 140 and a desired thermal performance for conducting heat energy away from the member. Further, in another alternative embodiment, the housing 160 of the cooling manifold 140 could be constructed without any grooves and could merely contact a member or a fluid to conduct heat energy away from the member or the fluid.

Figure 8:
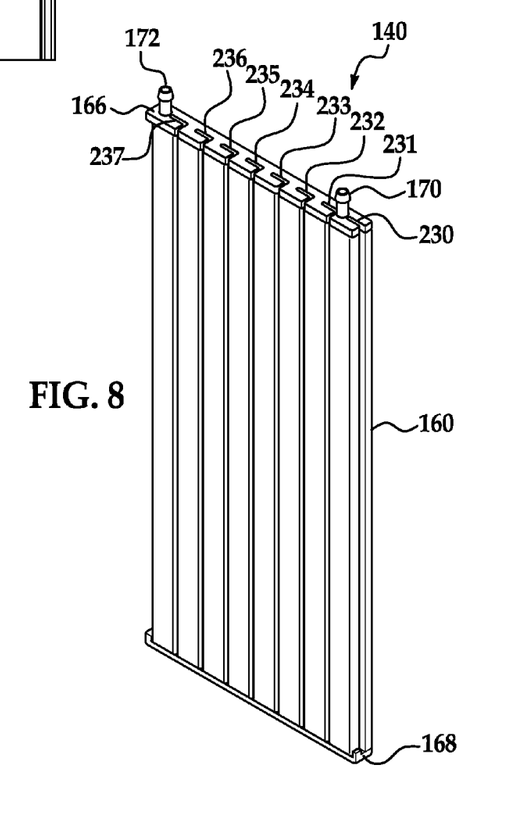
FIG. 8 is a schematic of a cooling manifold utilized in the battery module of FIG. 2 in accordance with another exemplary embodiment.
Figure 9:
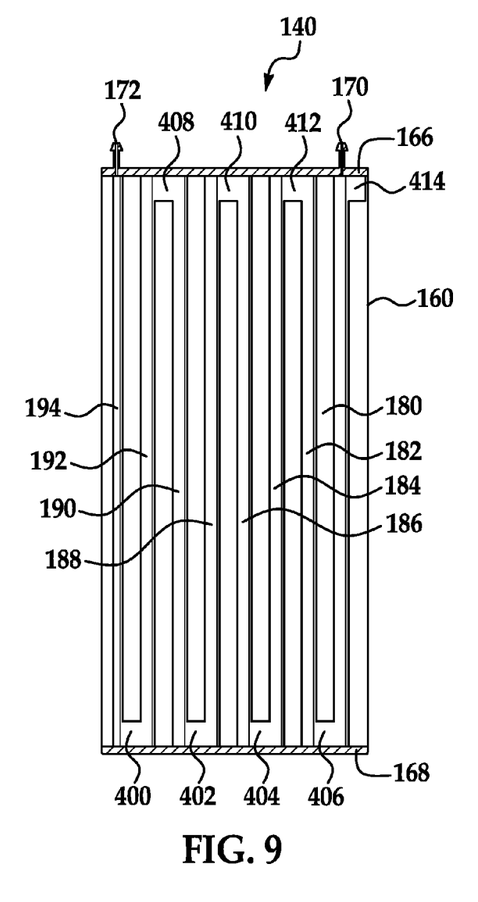
FIG. 9 is a cross-sectional schematic of the cooling manifold of FIG. 8.
Figure 10:
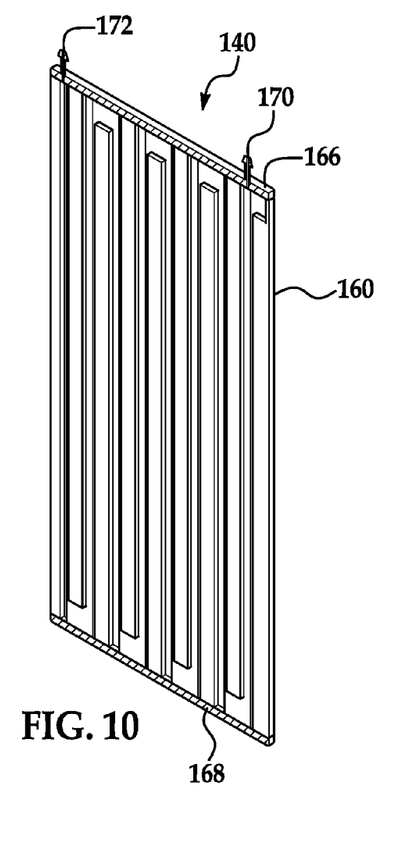
FIG. 10 is another cross-sectional schematic of the cooling manifold of FIG. 8.
Figure 11:
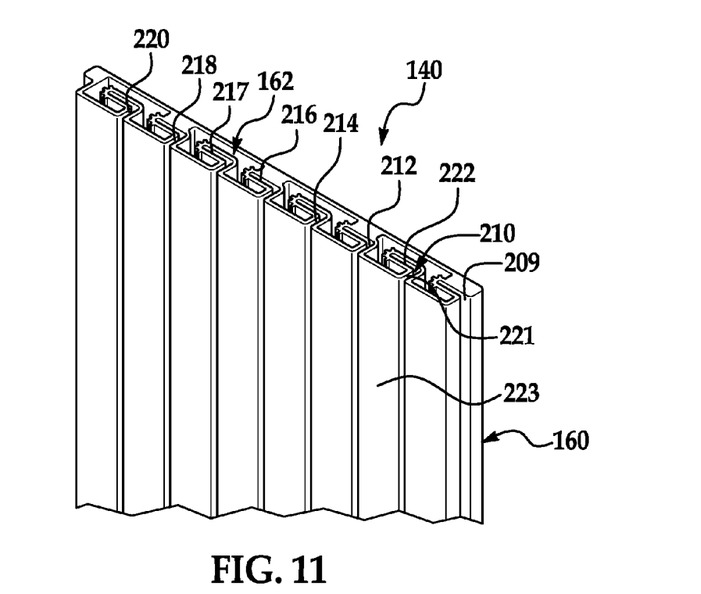
FIG. 11 is an enlarged schematic of the portion of the cooling manifold of FIG. 8.
Figure 12:
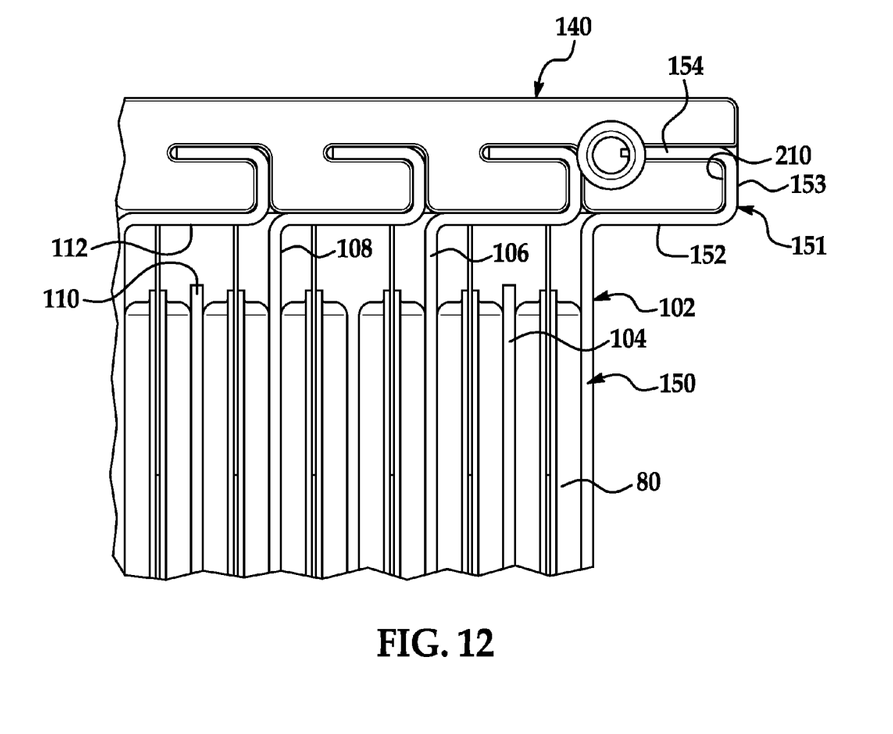
FIG. 12 is a schematic of a top portion of the battery module of FIG. 2 illustrating graphite sheets and a portion of the cooling manifold of FIG. 11.

The bottom cap 168 is fixedly coupled to a bottom surface of the housing 160 to seal a first end of the housing 160.

The top cap 166 is fixedly coupled to a top surface of the housing 160 to seal a second end of the housing 160. The fluid ports 170, 172 are disposed on the top cap 166 over first and second apertures, respectively, extending through the top cap 166 such that the fluid ports 170, 172 fluidly communicate with the first and second apertures, respectively. The top cap 166 further includes grooves 230, 231, 232, 233, 234, 235, 236, 237 extending therethrough that communicate with the grooves 209, 210, 212, 214, 216, 217, 218, 220, respectively, in the housing 160 for receiving corresponding graphite sheets therein.

During operation, refrigerant flows through the fluid port 170 and into the interior region 162 of the housing 160 and then through the serpentine flow path defined therein and then out through the fluid port 172. The refrigerant extracts heat energy from the housing 160 to cool the housing 160 and the graphite sheets, that further cools the battery cells in the battery module 20.

Referring to FIGS. 2, 3 and 4, the cooling manifold 142 is provided to conduct heat energy from the graphite sheets into a refrigerant flowing through the cooling manifold 142. The cooling manifold 142 includes an extruded housing 240, a top cap 241, a bottom cap 242, and fluid ports 243, 244. The housing 240, the top cap 241, the bottom cap 242, and the fluid ports 243, 244 can be constructed from at least one of aluminum, copper, silver, gold, and alloys thereof. It should be noted that the structure of the cooling manifold 142 is identical to the cooling manifold 140 discussed above. The housing 240 defines grooves 250, 251, 252, 253, 254, 255, 256, 257 extending therein for receiving corresponding extension portions of graphite sheets therein.

The bottom cap 242 is fixedly coupled to a bottom surface of the extruded housing 240 to seal a first end of the housing 240.

The top cap 241 is fixedly coupled to a top surface of the housing 240. The fluid ports 243, 244 are disposed on the top cap 241 over first and second apertures, respectively, extending through the top cap 241 such that the fluid ports 243, 240 fluidly communicate with the first and second apertures, respectively. The top cap 241 further includes grooves 260, 261, 262, 263, 264, 265, 266, 267 extending therethrough that communicate with the grooves 250, 251, 252, 253, 254, 255, 256, 257, respectively in the housing 240.

During operation, refrigerant flows through the fluid port 243 and into the interior region of the housing 240 and then through the serpentine flow path defined therein and then through the fluid port 244. The refrigerant extracts heat energy from the housing 240 to cool the housing 240 and the graphite sheets coupled thereto, that further cools the battery cells.

Figure 13:
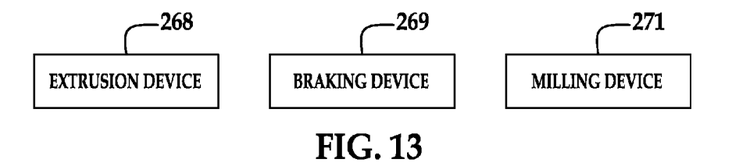
FIG. 13 is a schematic of an extrusion device and a brazing device utilized to construct the cooling manifold of FIG. 8.
Figure 14:
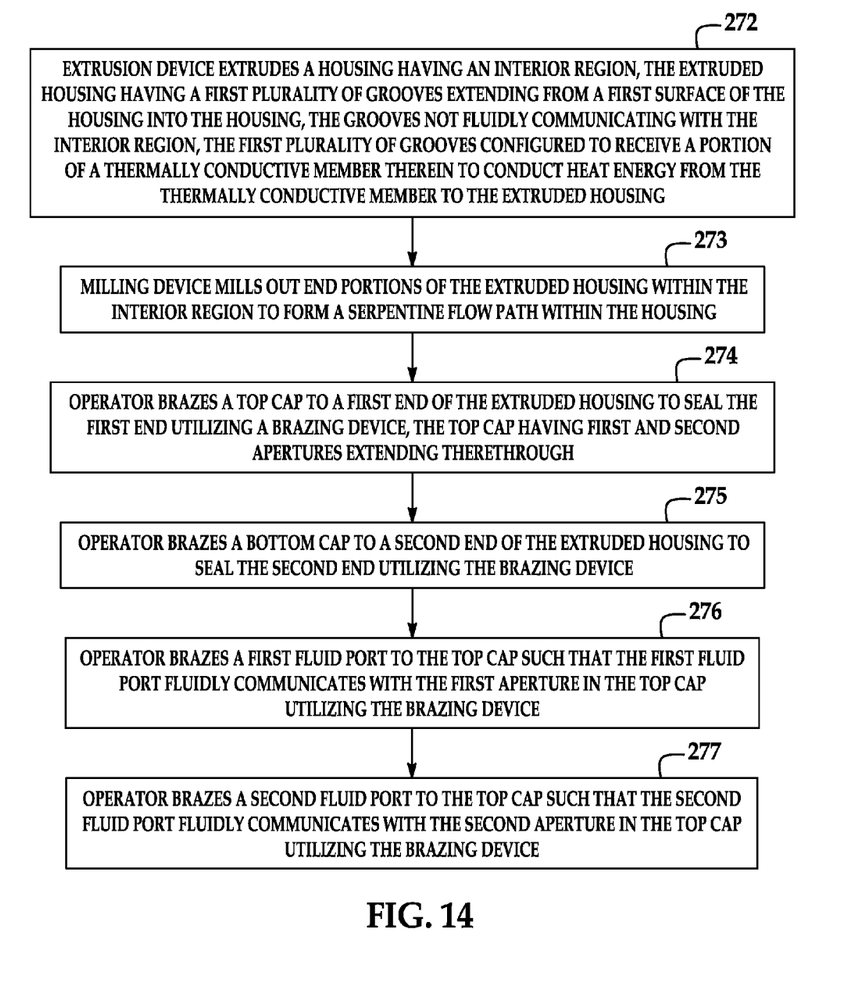
FIG. 14 is a flowchart of a method for constructing the cooling manifold of FIG. 8 in accordance with another exemplary embodiment.

Referring to FIGS. 9, 13 and 14, a flowchart of a method for manufacturing the cooling manifold 140 in accordance with another exemplary embodiment will now be explained.

At step 272, an extrusion device 268 extrudes a housing 160 having an interior region 162. The extruded housing 160 has a first plurality of grooves 210, 212, 214, 216, 218, 220 extending from a first surface of the extruded housing 160 into the housing 160. The grooves do not fluidly communicate with the interior region 162. Further, the first plurality of grooves are configured to receive a portion of a thermally conductive member (e.g., the graphite sheet 80) therein to conduct heat energy from the thermally conductive member to the extruded housing 160.

At step 273, a milling device 271 mills out end portions of the extruded housing 160 within the interior region 162 to form a serpentine flow path within the housing 160. For example, the milling device 271 mills out portions of a first end of the extruded housing 160 to form open regions 400, 402, 404, 406 therein. Further, the milling device 271 mills out portions of a second end of the extruded housing 160 to form open regions 408, 410, 412, 414 therein. The serpentine flow path within the housing 160 is defined by the open regions 400, 402, 404, 406, 408, 410, 412, 414 and the flow channels 180, 182, 184, 186, 188, 190, 192, 194.

At step 274, an operator brazes the top cap 166 to a first end of the extruded housing 160 to seal the first end utilizing a brazing device 269. The top cap 166 has first and second apertures extending therethrough.

At step 275, the operator brazes the bottom cap 168 to a second end of the extruded housing 160 to seal the second end utilizing the brazing device 269.

At step 276, the operator brazes a first fluid port 170 to the top cap 166 such that the first fluid port fluidly communicates with the first aperture in the top cap 166 utilizing the brazing device 269.

At step 277, the operator brazes a second fluid port 172 to the top cap 166 such that the second fluid port 172 fluidly communicates with the second aperture in the top cap 166 utilizing the brazing device 269.

Referring again to FIG. 1, the compressor 22 is configured to pump a refrigerant through the conduit 28 into the battery module 20 in response to a control signal from the microprocessor 40. As shown, the conduit 28 is fluidly coupled to the compressor 22 and the ports 170, 243 of the battery module 20. The conduit 30 is fluidly coupled to the ports 172, 244 of the battery module 20 and the condenser 24. After exiting the battery module 20, the refrigerant is further pumped through the conduit 30 to the condenser 24.

The condenser 24 is provided to extract heat energy from the refrigerant flowing therethrough to cool the refrigerant. As shown, a conduit 32 is fluidly coupled between the condenser 24 and the compressor 22. After exiting the condenser 24, the refrigerant is further pumped through the conduit 32 to the compressor 22.

The temperature sensor 36 is provided to generate a signal indicative of a temperature level of the battery module 20 that is received by the microprocessor 40.

The fan 38 is provided to urge air past the condenser 24 to cool the condenser 24 in response to a control signal from the microprocessor 40. As shown, the fan 38 is disposed proximate to the condenser 24. In an alternative embodiment, the condenser 24 is a liquid to refrigerant condenser.

The microprocessor 40 is provided to control operation of the battery system 10. In particular, the microprocessor 40 is configured to generate control signals for controlling operation of the compressor 22 and the fan 38, in response to a signal from the temperature sensor 36, as will be explained in greater detail below.

Figure 15:
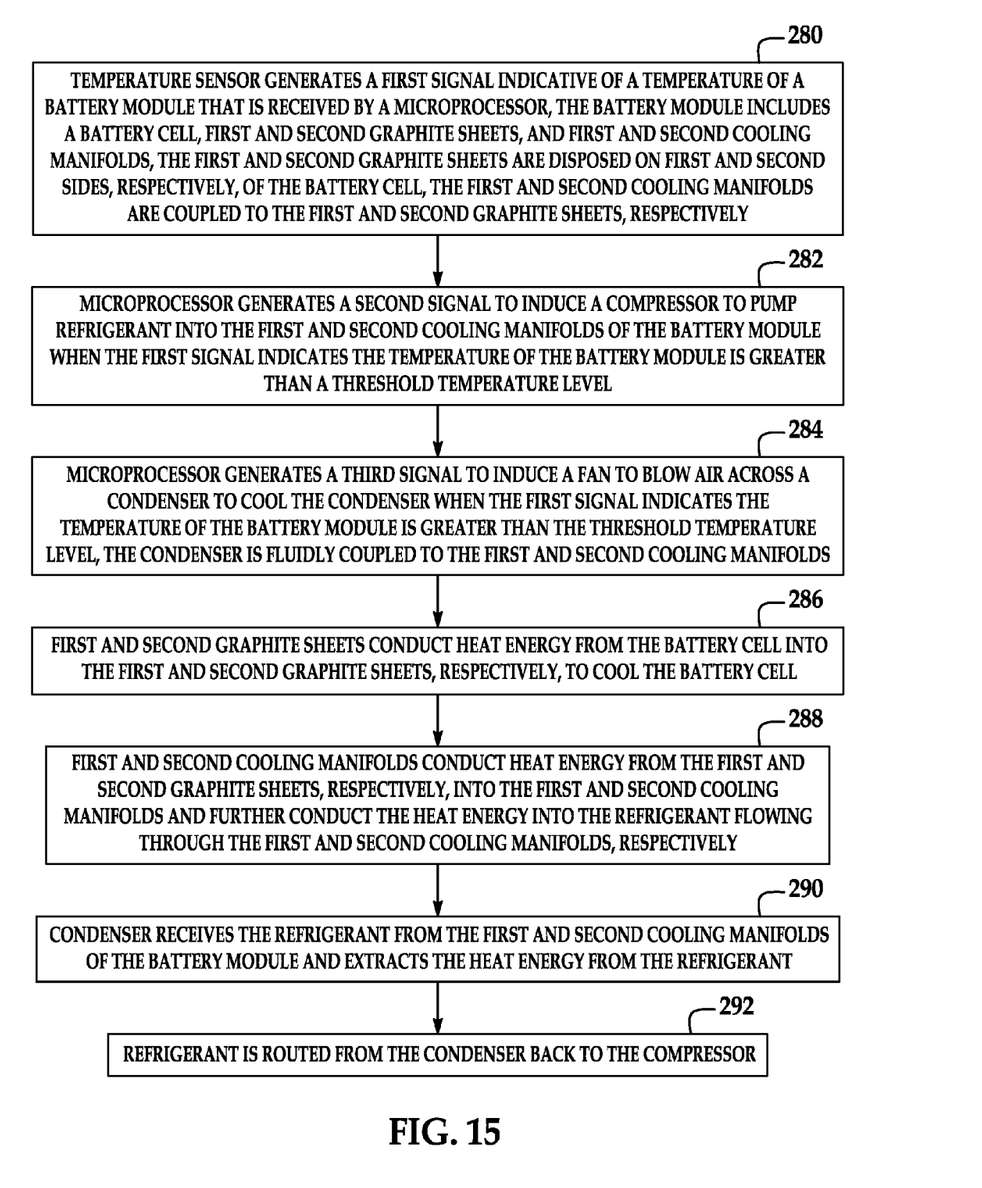
FIG. 15 is a flowchart of a method for cooling the battery module in the battery system of FIG. 1 in accordance with another exemplary embodiment.

Referring to FIG. 15, a flowchart of a method for cooling a battery module in accordance with another exemplary embodiment will now be explained. For purposes of simplicity, the method will be described utilizing a single battery cell and a pair of graphite sheets in a battery module. Of course, additional battery cells and graphite sheets could be utilized.

At step 280, the temperature sensor 36 generates a first signal indicative of a temperature of the battery module 20 that is received by the microprocessor 40. The battery module 20 includes the battery cell 80, graphite sheets 102, 104, and cooling manifolds 140, 142. The graphite sheets 102, 104 are disposed on first and second sides, respectively, of the battery cell 80. The cooling manifolds 140, 142 are coupled to the graphite sheets 102, 104, respectively.

At step 282, the microprocessor 40 generates a second signal to induce the compressor 22 to pump refrigerant into the cooling manifolds 140, 142 of the battery module 20 when the first signal indicates the temperature of the battery module 20 is greater than a threshold temperature level.

At step 284, the microprocessor 40 generates a third signal to induce the fan 38 to blow air across the condenser 24 to cool the condenser 24 when the first signal indicates the temperature of the battery module 20 is greater than the threshold temperature level. The condenser 24 is fluidly coupled to the cooling manifolds 140, 142.

At step 286, the graphite sheets 102, 104 conduct heat energy from the battery cell 80 into the graphite sheets 102, 104 to cool the battery cell 20.

At step 288, the cooling manifolds 140, 142 conduct heat energy from the graphite sheets 102, 104 into the cooling manifolds 140, 142 and further conduct the heat energy into the refrigerant flowing through the cooling manifolds 140, 142.

At step 290, the condenser 24 receives the refrigerant from the cooling manifolds 140, 142 of the battery module 20 and extracts the heat energy from the refrigerant.

At step 292, the refrigerant is routed from the condenser 24 back to the compressor 22.

Figure 16:
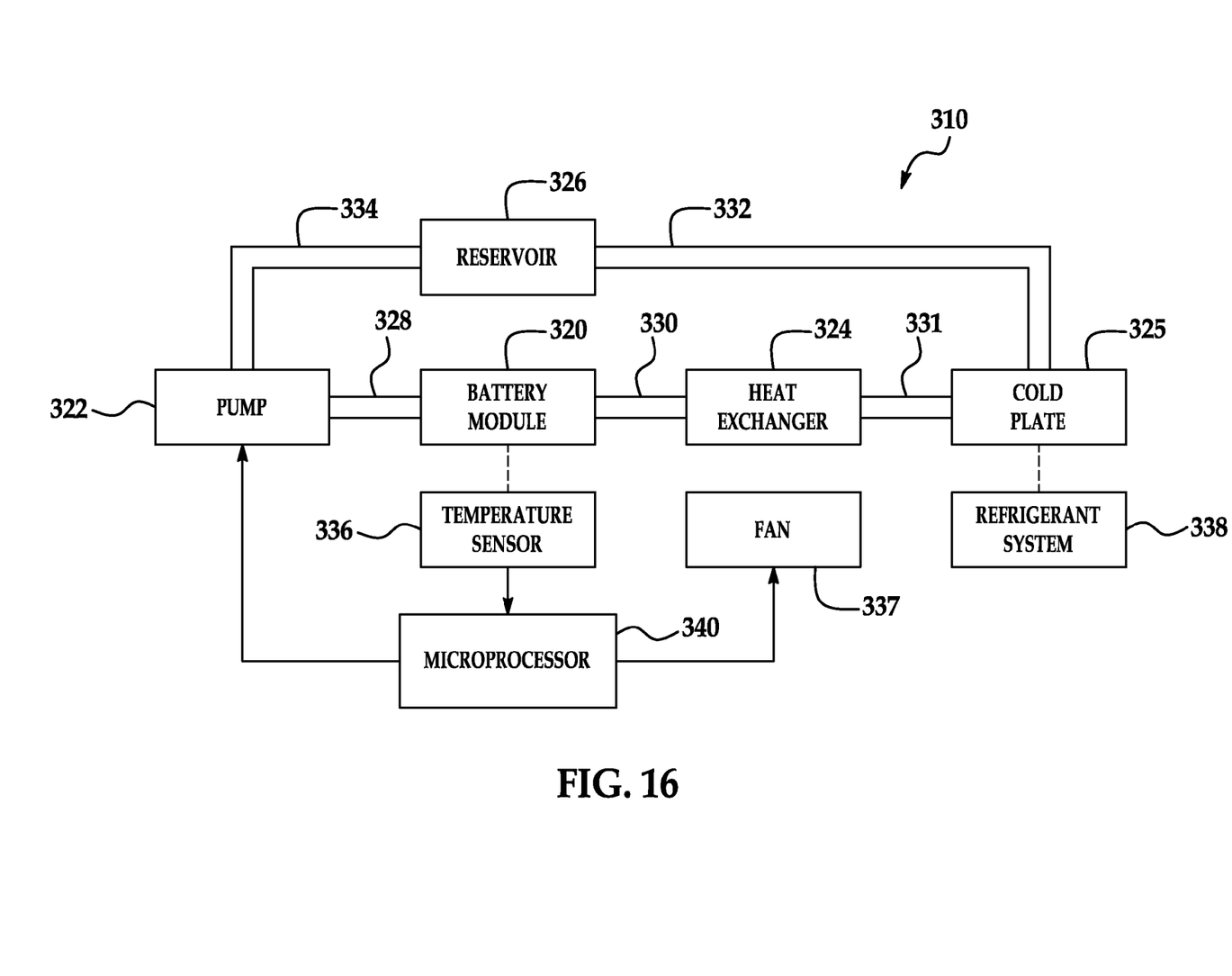
FIG. 16 is a schematic of a battery system in accordance with another exemplary embodiment.

Referring to FIG. 16, a battery system 310 for generating electrical power in accordance with another exemplary embodiment is illustrated. The battery system 310 includes a battery module 320, a pump 322, a heat exchanger 324, a cold plate 325, a reservoir 326, a fan 337, conduits 328, 330, 331, 332, 334, a temperature sensor 336, a refrigerant system 338, and a microprocessor 340. The primary difference between the battery system 310 and the battery system 10 is that the battery system 310 utilizes a coolant instead of a refrigerant to cool the battery module 320.

The battery module 320 has an identical structure as the battery module 20 discussed above.

The pump 322 is configured to pump a coolant through the conduit 328 into the battery module 320 in response to a control signal from the microprocessor 340. As shown, the conduit 328 is fluidly coupled between the pump 322 and the battery module 320, and the conduit 330 is fluidly coupled between the battery module 320 and the heat exchanger 324. After exiting the battery module 320, the coolant is further pumped through the conduit 330 to the heat exchanger 324.

The heat exchanger 324 is provided to extract heat energy from the coolant flowing therethrough to cool the coolant. As shown, a conduit 331 is fluidly coupled between the heat exchanger 324 and the cold plate 325. After exiting the heat exchanger 324, the coolant is further pumped through the conduit 331 to the cold plate 325.

The fan 337 is provided to urge air past the heat exchanger 324 to cool the heat exchanger 324 in response to a control signal from the microprocessor 340. As shown, the fan 337 is disposed proximate to the heat exchanger 324.

The cold plate 325 is provided to extract heat energy from the coolant flowing therethrough to further cool the coolant. As shown, a conduit 322 is fluidly coupled between the cold plate 325 and the reservoir 326. After exiting the cold plate 325, the coolant is further pumped through the conduit 332 to the reservoir 326.

The reservoir 326 is provided to store at least a portion of the coolant therein. As shown, a conduit 334 is fluidly coupled between the reservoir 326 and the pump 322. After exiting the reservoir 326, the coolant is further pumped through the conduit 334 to the pump 322.

The temperature sensor 336 is provided to generate a signal indicative of a temperature level of the battery module 320 that is received by the microprocessor 340.

The refrigerant system 338 is provided to cool the heat exchanger 324 in response to a control signal from the microprocessor 340. As shown, the refrigerant system 338 is operably coupled to the cold plate 325.

The microprocessor 340 is provided to control operation of the battery system 310. In particular, the microprocessor 340 is configured to generate control signals for controlling operation of the pump 322, the fan 337, and the refrigerant system 338 in response to a signal from the temperature sensor 336, as will be explained in greater detail below.

Figure 17:
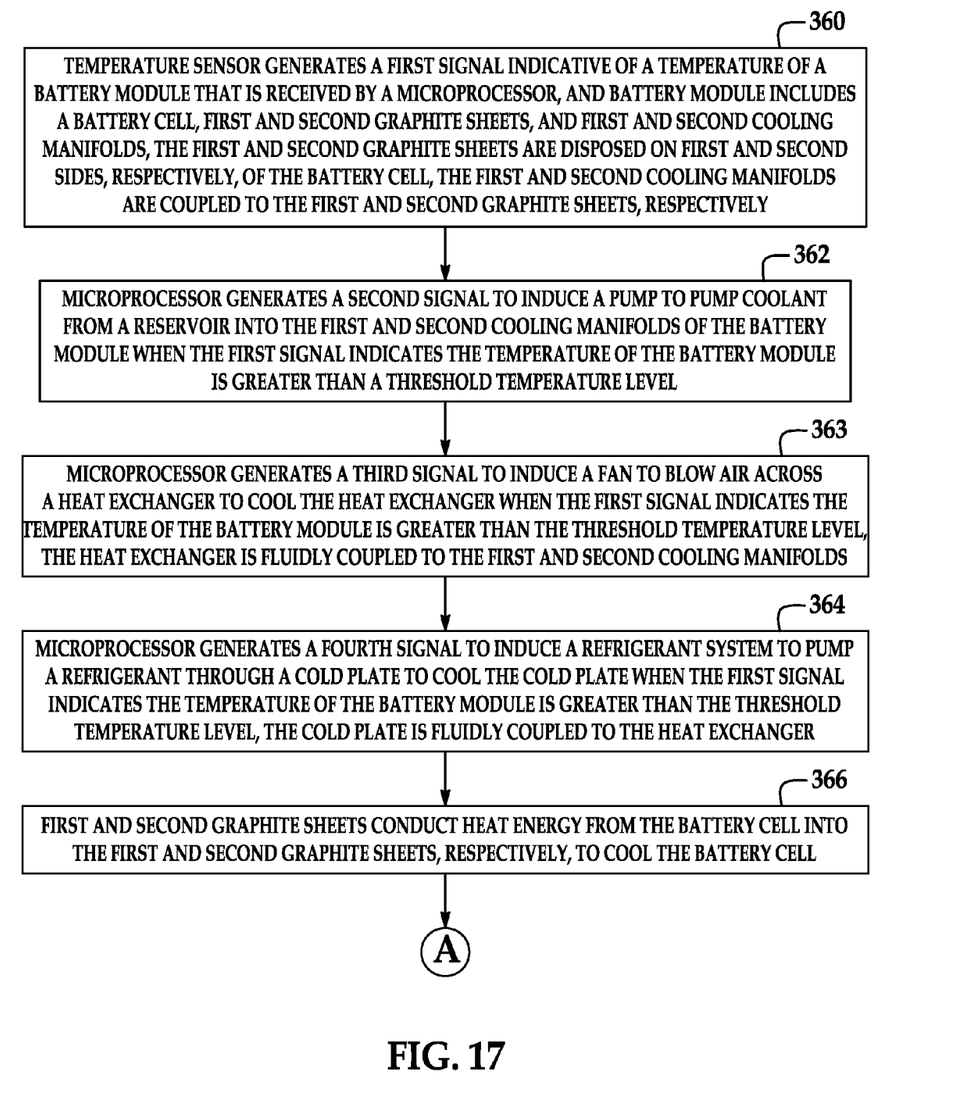
FIGS. 17-18 are flowcharts of a method for cooling a battery module in the battery system of FIG. 16 in accordance with another exemplary embodiment.
Figure 18:
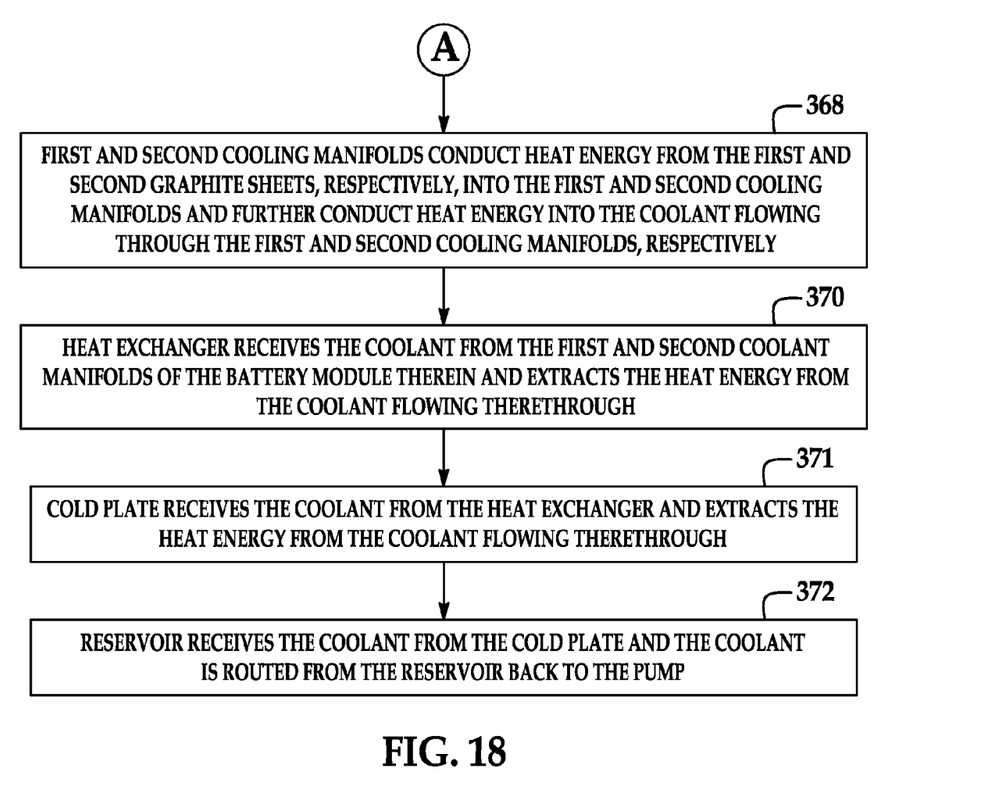

Referring to FIGS. 17-18, a flowchart of a method for cooling the battery module 320 in accordance with another exemplary embodiment is provided. For purposes of simplicity, the method will be described utilizing a single battery cell and a pair of graphite sheets in a battery module. Of course, additional battery cells and graphite sheets could be utilized.

At step 360, the temperature sensor 336 generates a first signal indicative of a temperature of the battery module 320 that is received by the microprocessor 340. The battery module 320 includes a battery cell, first and second graphite sheets, and first and second cooling manifolds. The first and second graphite sheets are disposed on first and second sides, respectively, of the battery cell. The first and second cooling manifolds are coupled to the first and second graphite sheets, respectively.

At step 362, the microprocessor 340 generates a second signal to induce the pump 322 to pump coolant from the reservoir 326 into the first and second cooling manifolds of the battery module 320 when the first signal indicates the temperature of the battery module 320 is greater than a threshold temperature level.

At step 363, the microprocessor 340 generates a third signal to induce the fan 337 to blow air across the heat exchanger 324 to cool the heat exchanger 324 when the first signal indicates the temperature of the battery module 320 is greater than the threshold temperature level. The heat exchanger 324 is fluidly coupled to first and second cooling manifolds of the battery module 320.

At step 364, the microprocessor 340 generates a fourth signal to induce the refrigerant system 338 to pump a refrigerant through a portion of the cold plate 325 to cool the cold plate 325 when the first signal indicates the temperature of the battery module 320 is greater than the threshold temperature level. The cold plate 325 is fluidly coupled to the heat exchanger 324.

At step 366, the first and second graphite sheets conduct heat energy from the battery cell into the first and second graphite sheets, respectively, to cool the battery cell.

At step 368, the first and second cooling manifolds conduct heat energy from the first and second graphite sheets, respectively, into the first and second cooling manifolds and further conduct the heat energy into the coolant flowing through the first and second cooling manifolds, respectively.

At step 370, the heat exchanger 324 receives the coolant from the first and second cooling manifolds of the battery module 320 therein and extracts the heat energy from the coolant flowing therethrough.

At step 371, the cold plate 325 receives the coolant from the heat exchanger 324 and extracts the heat energy from the coolant flowing therethrough.

At step 372, the reservoir 326 receives the coolant from the cold plate 325 and the coolant is routed from the reservoir 326 back to the pump.

The cooling manifold and the method for manufacturing the cooling manifold provide a substantial advantage over other devices and methods. In particular, the cooling manifold utilizes an extruded housing that defines a serpentine flow path therethrough for effectively removing heat energy from a thermally conductive member coupled to the cooling manifold.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed for carrying this invention, but that the invention will include all embodiments falling within the scope of the appended claims. Moreover, the use of the terms, first, second, etc. are used to distinguish one element from another. Further, the use of the terms a, an, etc. do not denote a limitation of quantity, but rather denote the presence of at least one of the referenced items.

What is claimed is:

1. A cooling manifold, comprising:
a thermally conductive member having a flat panel portion and an extension portion extending from the flat panel portion, the extension portion having first, second and third portions, the first portion extending from an end of the flat panel portion substantially perpendicular to the flat panel portion, the second portion extending from an end of the first portion substantially perpendicular to the first portion, the third portion extending from an end of the second portion substantially perpendicular to the second portion and substantially parallel to the first portion;

a housing that defines an interior region having a serpentine flow path therein, the housing having a first plurality of grooves extending from a first surface of the housing into the housing, the grooves do not fluidly communicate with the interior region, a first groove of the first plurality of grooves having first and second groove portions, the first groove portion extending into the housing perpendicular to the first surface, and the second groove portion extending from an end of the first groove portion parallel to the first surface; the first and second groove portions configured to receive the second and third portions, respectively, of the thermally conductive member therein, and the first surface configured to receive the first portion of the thermally conductive member thereon, to conduct heat energy from the thermally conductive member to the housing;

a top cap configured to seal a first end of the housing, the top cap having first and second apertures extending therethrough;

a bottom cap configured to seal a second end of the housing;

a first fluid port coupled to the top cap such that the first fluid port fluidly communicates with the first aperture in the top cap; and a second fluid port coupled to the top cap such that the second fluid port fluidly communicates with the second aperture in the top cap.

2. The cooling manifold of claim 1, wherein the housing is constructed from at least one of aluminum, copper, silver, and gold.

3. The cooling manifold of claim 1, wherein the top cap has a second plurality of grooves extending therethrough such that each groove of the second plurality of grooves communicates with a corresponding groove of the first plurality of grooves in the housing.

4. The cooling manifold of claim 1, wherein the thermally conductive member is constructed of graphite.

5. A cooling manifold, comprising:

a thermally conductive member having a flat panel portion and an extension portion extending from the flat panel portion, the extension portion having first, second and third portions, the first portion extending from an end of the flat panel portion substantially perpendicular to the flat panel portion, the second portion extending from an end of the first portion substantially perpendicular to the first portion, the third portion extending from an end of the second portion substantially perpendicular to the second portion and substantially parallel to the first portion;

a housing that defines an interior region having a serpentine flow path therein, the housing having a first plurality of grooves extending from a first surface of the housing into the housing, the grooves do not fluidly communicate with the interior region, a first groove of the first plurality of grooves having first and second groove portions, the first groove portion extending into the housing perpendicular to the first surface, and the second groove portion extending from an end of the first groove portion parallel to the first surface; the first and second groove portions configured to receive the second and third portions, respectively, of the thermally conductive member therein, and the first surface configured to receive the first portion of the thermally conductive member thereon, to conduct heat energy from the thermally conductive member to the housing;

a top cap configured to seal a first end of the housing, the top cap having a second plurality of grooves extending therethrough, a second groove of the second plurality of grooves communicating with the first groove of the first plurality of grooves in the housing, the second groove having third and fourth groove portions configured to receive the second and third portions, respectively, of the thermally conductive member therein;

a bottom cap configured to seal a second end of the housing;

a first fluid port coupled to the top cap such that the first fluid port fluidly communicates with the interior region of the housing; and a second fluid port coupled to the top cap such that the second fluid port fluidly communicates with the interior region of the housing.

6. The cooling manifold of claim 5, wherein the housing is constructed from at least one of aluminum, copper, silver, and gold.

7. The cooling manifold of claim 5, wherein the thermally conductive member is constructed of graphite.

* * * * *